(12) United States Patent
Wilkins

(10) Patent No.: US 6,525,983 B2
(45) Date of Patent: *Feb. 25, 2003

(54) DEVICE AND METHOD FOR REDUCING STANDBY CURRENT IN A MEMORY DEVICE BY DISCONNECTING BIT LINE LOAD DEVICES IN UNUSED COLUMNS OF THE MEMORY DEVICE FROM A SUPPLY VOLTAGE

(75) Inventor: James W. Wilkins, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/032,643

(22) Filed: Dec. 28, 2001

(65) Prior Publication Data

US 2002/0093866 A1 Jul. 18, 2002

(Under 37 CFR 1.47)

Related U.S. Application Data

(63) Continuation of application No. 09/513,805, filed on Feb. 25, 2000, now Pat. No. 6,335,891.
(60) Provisional application No. 60/121,534, filed on Feb. 25, 1999.

(51) Int. Cl.$^7$ .................................................. G11C 7/00
(52) U.S. Cl. ..................... 365/225.7; 365/154; 365/227
(58) Field of Search ................................. 365/154, 156, 365/225.7, 227, 200

(56) References Cited

U.S. PATENT DOCUMENTS

| | | | |
|---|---|---|---|
| 4,701,644 A | 10/1987 | Campione | 327/57 |
| 4,701,884 A | 10/1987 | Aoki et al. | 365/189.09 |
| 5,253,197 A | 10/1993 | Suzuki et al. | 365/49 |
| 5,276,647 A | 1/1994 | Matsui et al. | 365/201 |
| 5,309,401 A | 5/1994 | Suzuki et al. | 365/203 |
| 5,390,150 A * | 2/1995 | Kwak et al. | 365/154 |
| 5,521,874 A | 5/1996 | Sandhu | 365/207 |
| 5,579,266 A | 11/1996 | Tahara | 365/200 |
| 5,768,206 A * | 6/1998 | McClure | 365/225.7 |
| 6,018,488 A | 1/2000 | Mishima et al. | 365/225.7 |
| 6,335,891 B1 * | 1/2002 | Wilkins | 365/225.7 |

* cited by examiner

Primary Examiner—David Nelms
Assistant Examiner—Gene N. Auduong
(74) Attorney, Agent, or Firm—TraskBritt

(57) ABSTRACT

Bit line load circuitry that eliminates wasted standby current flowing to an unused (i.e., repaired-out) column in a Static Random Access Memory (SRAM) device includes a fuse or an anti-fuse interposed between one or more PMOS bit line load devices in the unused column and the supply voltage. Blowing the fuse or anti-fuse isolates the bit line load devices from the supply voltage so the devices draw no current, thus reducing the total standby current of the SRAM device. The fuse may be blown with a laser or with excessive current, and the anti-fuse may be blown with excessive voltage.

15 Claims, 4 Drawing Sheets

DEVICE AND METHOD FOR REDUCING STANDBY CURRENT IN A MEMORY DEVICE BY DISCONNECTING BIT LINE LOAD DEVICES IN UNUSED COLUMNS OF THE MEMORY DEVICE FROM A SUPPLY VOLTAGE

CROSS-REFERENCE TO RELATED APPLICATIONS

This application is a continuation of application Ser. No. 09/513,805, filed Feb. 25, 2000 now U.S. Pat. No. 6,335,891, issued Jan. 1, 2002, which claims the benefit of U.S. Provisional Application No. 60/121,534, filed Feb. 25, 1999.

BACKGROUND OF THE INVENTION

1. Field of the Invention

This invention relates in general to semiconductor memory devices and, more specifically, to devices and methods for reducing standby current in a semiconductor memory device, such as a Static Random Access Memory (SRAM), by disconnecting bit line load devices in unused columns of the memory device from a supply voltage.

2. State of the Art

As shown in FIG. 1, a conventional SRAM memory cell 10 is activated for storage of a logic bit when a wordline WL associated with the memory cell 10 goes high and turns on access NMOS transistors 12 and 14. A logic "0" bit, for example, to be stored in the memory cell 10 is then applied to bit lines BL and BL* as a low on the bit line BL and as a high on the bit line BL*. The high on the bit line BL* passes through the activated access transistor 14 to a storage node B, where it turns on a latching NMOS transistor 16, causing a current $I_{BL}$ to flow through a PMOS transistor bit line load device 18, down the bit line BL, and through the activated access transistor 12 and the activated latching transistor 16 to ground. At the same time, the low on the bit line BL, and the activated state of the latching transistor 16, pull a storage node A low, so that another latching NMOS transistor 20 is off. When the wordline WL subsequently goes low and turns off the access transistors 12 and 14, the storage node A remains low, and the storage node B remains high, so that a logic "0" bit is stored in the memory cell 10.

Of course, a logic "1" bit may also be stored in the memory cell 10. In this case, the wordline WL goes high to turn on the access transistors 12 and 14, and the logic "1" bit is applied to the bit lines BL and BL* as a high on the bit line BL and as a low on the bit line BL*. The high on the bit line BL passes through the activated access transistor 12 to the storage node A, where it turns on the latching transistor 20, causing a current $I_{BL*}$ to flow through another PMOS transistor bit line load device 22, down the bit line BL*, and through the activated access transistor 14 and the activated latching transistor 20 to ground. At the same time, the low on the bit line BL*, and the activated state of the latching transistor 20, pull the storage node B low, so that the latching transistor 16 is off. When the wordline WL subsequently goes low and turns off the access transistors 12 and 14, the storage node B remains low, and the storage node A remains high, so that a logic "1" bit is stored in the memory cell 10.

Examples of conventional SRAM devices that operate substantially as described above may be found in U.S. Pat. No. 5,521,874 to Sandhu and U.S. Pat. No. 5,276,647 to Matsui et al.

Periodically, SRAM memory cells, such as the memory cell 10, are found to be defective during manufacturing as a result of fabrication or other manufacturing errors. When this occurs, the rows or columns that contain these defective memory cells are typically switched out of service and replaced by redundant rows or columns. Thus, for example, if the memory cell 10 is found to be defective, its associated column 24 may be switched out of service and replaced by a redundant column 26. The redundant column 26 typically shares the wordline WL with the switched out column 24, but has its own bit lines 28 and 30 and associated PMOS transistor bit line load devices 32 and 34.

During memory operations, the wordline WL goes high when any memory cell attached to the wordline WL, such as a redundant memory cell 36 in the redundant column 26, is to be activated. Thus, for example, if a data bit is to be written to, or read from, the redundant memory cell 36, or the redundant memory cell 36 is to be refreshed, the wordline WL goes high.

Because the defective memory cell 10 in the column 24 remains attached to the wordline WL even after the column 24 has been switched out of service, the currents $I_{BL}$ and $I_{BL*}$ still flow to ground through the memory cell 10 whenever the wordline WL goes high to activate a memory cell. Thus, in standby mode, when memory cells, such as the redundant memory cell 36, are refreshed, the currents $I_{BL}$ and $I_{BL*}$ flow to ground at the same time. As a result, these currents add unnecessarily to the standby current flowing during the standby mode. Although the additional standby current caused by a single replaced column is generally insignificant, the size of modern memory devices typically necessitates tens or hundreds of columns being replaced, and the additional standby current caused by these tens or hundreds of replaced columns can be significant and problematic. Indeed, if the additional standby current drawn by these multiple replaced columns causes the total standby current in a memory device to exceed a specified maximum, then the memory device is typically scrapped.

Therefore, there is a need in the art for a device and method for reducing standby current flowing to unused columns in memory devices.

SUMMARY OF THE INVENTION

Inventive bit line load circuitry that eliminates wasted standby current flowing to an unused column in a memory device includes a programmable circuit, such as a fuse or anti-fuse, interposed between one or more bit line load devices in the unused column and the supply voltage. Programming the programmable circuit causes the circuit to isolate the bit line load devices from the supply voltage so the devices draw no current, thus reducing the total standby current of the memory device. The programmable circuit may be programmed by blowing a fuse with a laser or with excessive current, or by blowing an anti-fuse with excessive voltage.

In other embodiments of the present invention, the bit line load circuitry described above is incorporated into a memory device, such as a Static Random Access Memory Device (SRAM), and an electronic system, or is fabricated on the surface of a semiconductor wafer.

In another embodiment of the present invention, a method for reducing standby current in a memory device having unused columns includes isolating bit line load devices of the unused columns from the supply voltage.

In still another embodiment, a method of repairing a defective memory cell in a memory device having a plurality of memory cells arranged in rows and columns includes switching a column of memory cells containing the defective memory cell out of service. A redundant column of memory cells is enabled to replace the switched-out column, and programmable circuitry provided between bit line load devices of the switched-out column and a supply voltage is then programmed to isolate the bit line load devices of the switched-out column from the supply voltage.

DETAILED DESCRIPTION OF THE INVENTION

Figure 1:
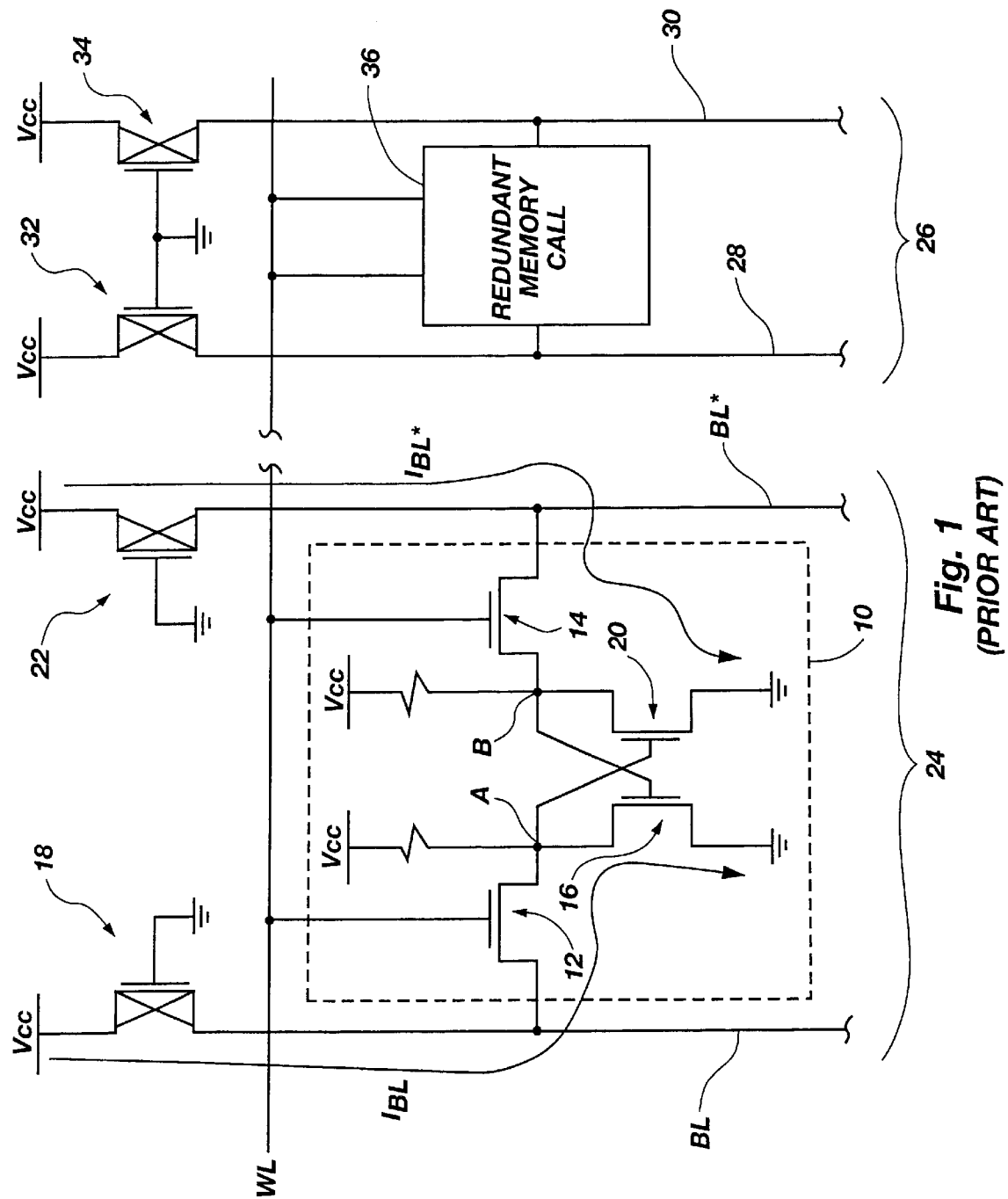
FIG. 1 is a schematic of portions of columns in a conventional Static Random Access Memory (SRAM) device.
Figure 2:
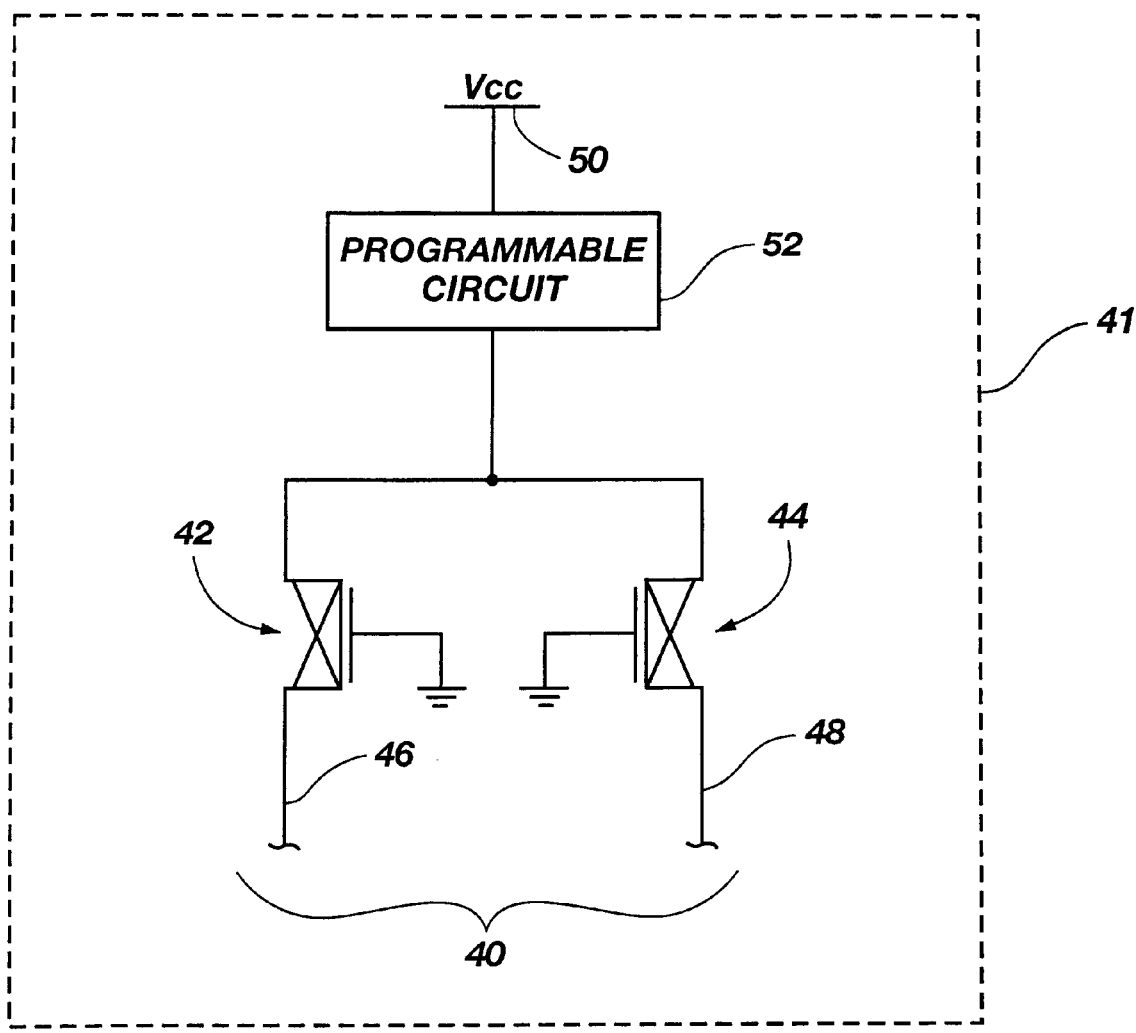
FIG. 2 is a schematic of a programmable circuit, such as a fuse, isolating an unused column in an SRAM device from a supply voltage $V_{CC}$ to reduce the standby current in the SRAM device in accordance with the present invention.

As shown in FIG. 2, a column 40 of a Static Random Access Memory (SRAM) device 41 is switched out of service during manufacturing due to one or more defective memory cells (not shown) as previously described. Although the present invention will be described with respect to an SRAM column, it should be understood that the present invention is applicable to any memory device that draws standby current.

Although PMOS transistor bit line load devices 42 and 44 would normally draw current for bit lines 46 and 48 of the column 40 from the supply voltage $V_{cc}$ through a supply voltage conductor 50, a programmable circuit 52 is programmed when the column 40 is switched out of service to isolate the load devices 42 and 44 from the supply voltage conductor 50. Thus, no current flows to the load devices 42 and 44 during memory operations, so the total standby current of the SRAM device (not shown) is reduced. It should be understood that the present invention is not limited to PMOS transistor bit line load devices, but, rather, includes within its scope any bit line load device.

Figure 3A:
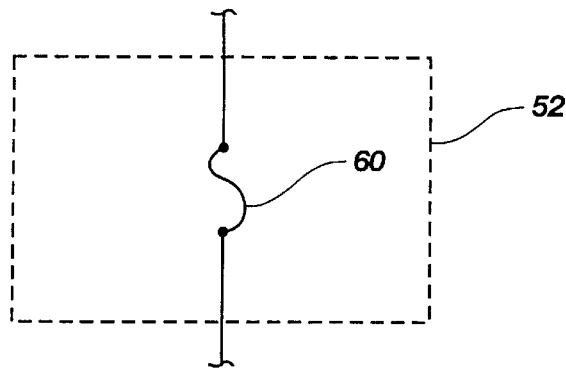
FIGS. 3A, 3B, and 3C are schematics of alternative embodiments of the programmable circuit FIG. 2.

As shown in FIG. 3A, the programmable circuit 52 includes a fuse 60, such as a polysilicon fuse, that passes current from the supply voltage $V_{CC}$ (FIG. 2) to the load devices 42 and 44 (FIG. 2) when not programmed, and is programmed to isolate the load devices 42 and 44 (FIG. 2) from the supply voltage $V_{CC}$ (FIG. 2) by being blown by excessive current or, more commonly, by a laser.

Figure 3B:
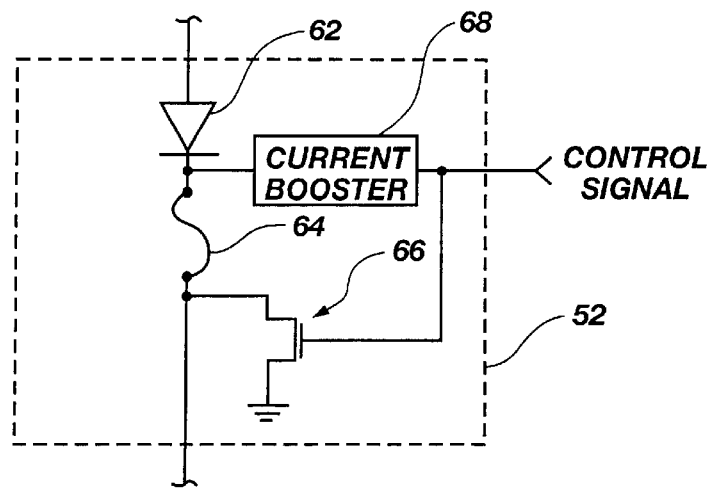

As shown in FIG. 3B, the programmable circuit 52 includes a diode 62 that, in the non-programmed state of the circuit 52, forward biases when the supply voltage $V_{CC}$ (FIG. 2) is applied to its anode, thereby allowing current to pass through a fuse 64 to the load devices 42 and 44 (FIG. 2). To program the circuit 52, a control signal turns on an NMOS transistor 66 and a current booster 68, thereby allowing the current booster 68 to blow the fuse 64 by driving excessive current through the fuse 64.

Figure 3C:
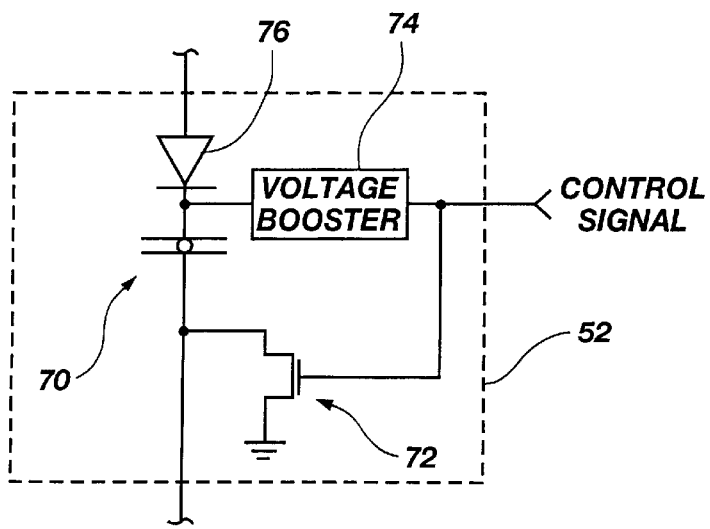

As shown in FIG. 3C, the programmable circuit 52 includes an anti-fuse 70 that, in the programmed state of the circuit 52, isolates the supply voltage $V_{CC}$ (FIG. 2) from the load devices 42 and 44 (FIG. 2). To place the circuit 52 in its non-programmed state, a control signal turns on an NMOS transistor 72 and a voltage booster 74, thereby allowing the voltage booster 74 to blow the anti-fuse 70 by applying excessive voltage across the anti-fuse 70. As a result, in the non-programmed state of the circuit 52, a diode 76 forward biases when the supply voltage $V_{CC}$ (FIG. 2) is applied to its anode, thereby allowing current to pass through the blown anti-fuse 70 to the load devices 42 and 44 (FIG. 2).

Of course, it should be understood that a wide variety of programmable circuits fall within the scope of the present invention, and that those shown in FIGS. 3A, 3B, and 3C are intended to be exemplary only.

Figure 4:
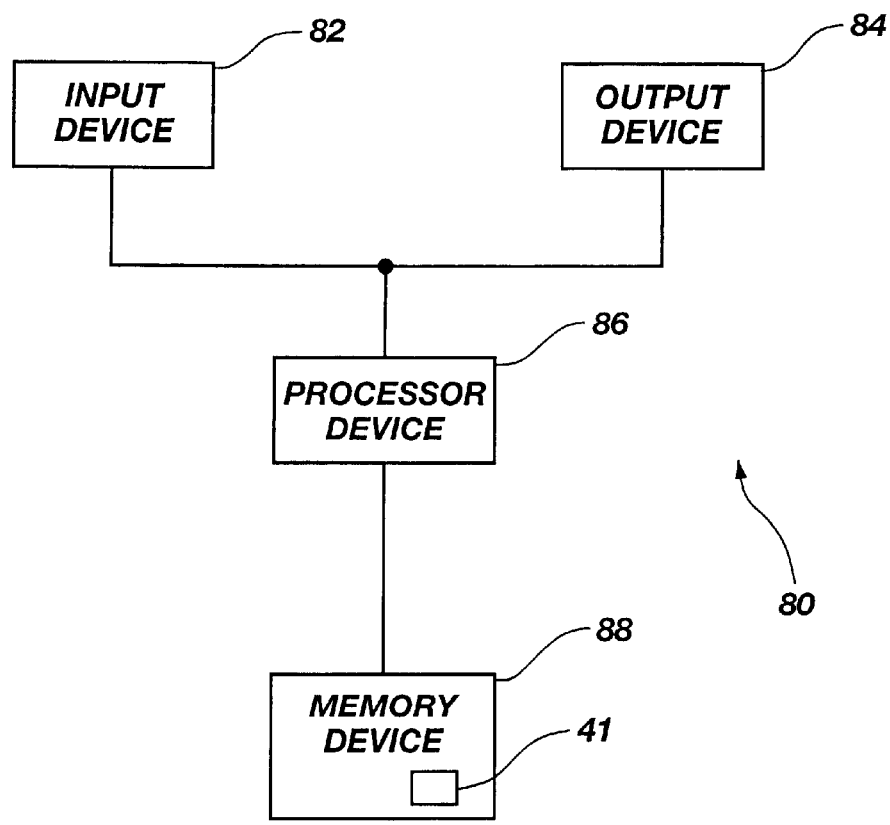
FIG. 4 is a block diagram of an electronic system including the SRAM device of FIG. 2 in accordance with the present invention.
Figure 5:
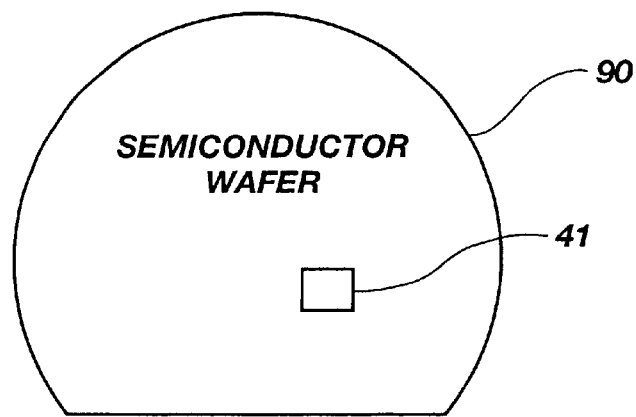
FIG. 5 is a diagram of a semiconductor wafer on which is fabricated the SRAM device of FIG. 2 in accordance with the present invention.

As shown in FIG. 4, an electronic system 80 includes an input device 82, an output device 84, a processor device 86, and a memory device 88 that incorporates the SRAM device 41 of FIG. 2. Of course, any one of the devices 82, 84, 86, and 88 may incorporate the SRAM device 41 of FIG. 2. As shown in FIG. 5, a semiconductor wafer 90 includes the SRAM device 41 of FIG. 2 fabricated on its surface.

Although the present invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. Bit line load circuitry comprising:
   a supply voltage conductor;
   a bit line load device; and
   a programmable circuit coupled between the supply voltage conductor and the bit line load device for coupling the supply voltage conductor to the bit line load device in a non-programmed state and for isolating the supply voltage conductor from the bit line load device in a programmed state, wherein the programmable circuit is selectively programmed upon receipt of a control signal.

2. The bit line load circuitry of claim 1 wherein the bit line load device comprises a PMOS transistor.

3. The bit line load circuitry of claim 1 wherein the programmable circuit includes at least one of a fuse and an anti-fuse.

4. Bit line load circuitry comprising:
   a supply voltage conductor;
   a bit line load device; and
   a programmable circuit coupled between the supply voltage conductor and the bit line load device for coupling the supply voltage conductor to the bit line load device in a non-programmed state and for isolating the supply voltage conductor from the bit line load device in a programmed state, wherein the programmable circuit is selectively programmed upon receipt of a control signal,
   wherein the programmable circuit comprises:
      a diode and one of a fuse and an anti-fuse coupled in series between the supply voltage conductor and the bit line load device;
      one of a current booster and a voltage booster coupled to the control signal and the one of the fuse and anti-fuse for blowing the one of the fuse and anti-fuse; and an NMOS transistor coupled to the control signal and the one of the fuse and anti-fuse for providing a current path to ground when the one of the fuse and anti-fuse is blown.

5. A memory device comprising:

memory cells arranged in rows and columns;

bit lines coupled to the memory cells;

bit line load devices coupled to the bit lines; and at least one programmable circuit coupled to at least one of the bit line load devices for providing a supply voltage to the at least one of the bit line load devices in a non-programmed state and for isolating the at least one of the bit line load devices from the supply voltage in a programmed state, wherein the at least one programmable circuit is selectively programmed upon receipt of a control signal.

6. The memory device of claim 5 wherein the memory cells comprise Static Random Access Memory (SRAM) cells.

7. The memory device of claim 5 wherein the bit line load devices comprise PMOS transistors.

8. The memory device of claim 5 wherein the at least one programmable circuit includes at least one of a fuse and an anti-fuse.

9. A memory device comprising:

memory cells arranged in rows and columns;

bit lines coupled to the memory cells;

bit line load devices coupled to the bit lines; and at least one programmable circuit coupled to at least one of the bit line load devices for providing a supply voltage to the at least one of the bit line load devices in a non-programmed state and for isolating the at least one of the bit line load devices from the supply voltage in a programmed state, wherein the at least one programmable circuit is selectively programmed upon receipt of a control signal, and wherein the at least one programmable circuit comprises:

a diode and one of a fuse and an anti-fuse coupled in series between the supply voltage and the at least one of the bit line load devices;

one of a current booster and a voltage booster coupled to the control signal and the one of the fuse and anti-fuse for blowing the one of the fuse and anti-fuse; and an NMOS transistor coupled to the control signal and the one of the fuse and anti-fuse for providing a current path to ground when the one of the fuse and anti-fuse is blown.

10. An electronic system comprising an input device, an output device, a memory device, and a processor device coupled to the input, output, and memory devices, at least one of the devices including bit line load circuitry including:

a supply voltage conductor;

a bit line load device; and a programmable circuit coupled between the supply voltage conductor and the bit line load device for coupling the supply voltage conductor to the bit line load device in a non-programmed state and for isolating the supply voltage conductor from the bit line load device in a programmed state, wherein the programmable circuit is selectively programmed upon receipt of a control signal.

11. The electronic system of claim 10 wherein the memory device comprises a Static Random Access Memory (SRAM) device.

12. The electronic system of claim 10 wherein the bit line load device comprises a PMOS transistor.

13. The electronic system of claim 10 wherein the programmable circuit includes at least one of a fuse and an anti-fuse.

14. An electronic system comprising an input device, an output device, a memory device, and a processor device coupled to the input, output, and memory devices, at least one of the devices including bit line load circuitry including:

a supply voltage conductor;

a bit line load device; and a programmable circuit coupled between the supply voltage conductor and the bit line load device for coupling the supply voltage conductor to the bit line load device in a non-programmed state and for isolating the supply voltage conductor from the bit line load device in a programmed state, wherein the programmable circuit is selectively programmed upon receipt of a control signal, and wherein the programmable circuit comprises:

a diode and one of a fuse and an anti-fuse coupled in series between the supply voltage conductor and the bit line load device;

one of a current booster and a voltage booster coupled to the control signal and the one of the fuse and anti-fuse for blowing the one of the fuse and anti-fuse; and an NMOS transistor coupled to the control signal and the one of the fuse and anti-fuse for providing a current path to ground when the one of the fuse and anti-fuse is blown.

15. A semiconductor wafer comprising a memory device fabricated on its surface, the memory device comprising:

memory cells arranged in rows and columns;

bit lines coupled to the memory cells;

bit line load devices coupled to the bit lines; and at least one programmable circuit coupled to at least one of the bit line load devices for providing a supply voltage to the at least one of the bit line load devices in a non-programmed state and for isolating the at least one of the bit line load devices from the supply voltage in a programmed state, wherein the at least one programmable circuit is selectively programmed upon receipt of a control signal.

* * * * *